(12) United States Patent
Shannon

(10) Patent No.: US 6,259,116 B1
(45) Date of Patent: *Jul. 10, 2001

(54) MULTIPLE MEMORY ELEMENT SEMICONDUCTOR MEMORY DEVICES

(75) Inventor: John M. Shannon, Whyteleafe (GB)

(73) Assignee: U.S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/177,012

(22) Filed: Oct. 22, 1998

(30) Foreign Application Priority Data

Oct. 22, 1997 (GB) .................................................. 9722149

(51) Int. Cl.$^7$ ........................... H01L 29/04; H01L 31/20; H01L 31/036; H01L 31/0376; H01L 47/00
(52) U.S. Cl. .................... 257/52; 257/2; 257/16; 257/55; 257/63
(58) Field of Search ................................ 257/16, 22, 35, 257/52, 55, 63, 2

(56) References Cited

U.S. PATENT DOCUMENTS

| | | | |
|---|---|---|---|
| 4,492,810 | * | 1/1985 | Ovshinsky et al. .................. 135/255 |
| 4,646,266 | * | 2/1987 | Ovshinsky et al. .................. 365/105 |
| 4,689,645 | * | 8/1987 | Ovshinsky et al. .................... 357/2 |
| 5,164,809 | * | 11/1992 | Street et al. ........................ 257/55 |

FOREIGN PATENT DOCUMENTS

9619837A2   6/1996   (WO) .

* cited by examiner

Primary Examiner—Eddie C. Lee
Assistant Examiner—Jesse A. Fenty
(74) Attorney, Agent, or Firm—Steven R. Biren (57) ABSTRACT

A semiconductor memory device using silicon-rich amorphous silicon alloy material memory elements that are electrically programmable by means of current induced conductivity comprises a layer (10) of the alloy material on opposing sides of which sets of input and output contacts (16, 18) are provided, and discrete conductive elements (20) within the layer which serve as nodes and define programmable conductive paths between input and output contacts to create a three dimensional memory network. The conductive elements can be arranged at one or more levels within the thickness of the alloy layer and preferably are of defined shape forming a predetermined 2D array at each level.

11 Claims, 4 Drawing Sheets

MULTIPLE MEMORY ELEMENT SEMICONDUCTOR MEMORY DEVICES

BACKGROUND OF THE INVENTION

The present invention relates to semiconductor memory devices comprising silicon-rich amorphous silicon alloy memory elements which are electrically-programmable through current induced conductivity.

A semiconductor memory device of the above kind is described in PCT WO 96/19837. The memory elements in this device comprise a layer of hydrogenated, silicon rich amorphous silicon alloy material, containing at least one other element in addition to hydrogen and silicon, for example nitrogen or carbon, which material is sandwiched between a pair of electrically conductive contact layers. The memory element is programmed by inducing a defect band throughout a region of the amorphous silicon alloy layer, for example by electrical current stressing, which lowers the activation energy for the transport of carriers in the layer by a selected amount which can be varied. By tailoring this defect band, or more specifically the concentration and distribution of energies of the defects in the defect band, the extent of the lowering of the activation energy level of the element can be selectively set to programme the element. The memory element is effectively an analogue memory element as the amount of activation energy lowering can be selected from a more or less continuous range rather than just two states. The memory elements differ from other known thin film memory elements using amorphous silicon alloy material of the so-called filamentary kind in which a localised filamentary region is produced by a so-called forming process which causes, it is believed, a top metal contact to diffuse into the doped amorphous silicon layer, in that their structure and operation does not involve or depend on the presence of filaments. Rather, the induced defect band leads to the element having a bulk controlled effect which is proportional to its area. These memory elements are highly reproducible and are capable of being programmed over a comparatively wide range, for example around three orders of magnitude or more. When fabricated in an array on a common substrate using common-deposited layers, the behaviour of individual memory elements is highly predictable and similar. Aforementioned PCT WO 96/19837 describes embodiments of memory devices comprising arrays of such memory elements. The memory elements are arranged in a 2D matrix array on a substrate and addressed via crossing sets of row and column conductors, with individual memory elements being defined at the respective intersections of the row and column address conductors. The array of memory elements is fabricated by depositing a layer of conductive material over the substrate, photolithographically patterning this layer to define one set of address conductors, depositing a continuous layer of the amorphous silicon alloy material over these conductors and then depositing a further layer of conductive material over the amorphous silicon alloy layer and photolithographically patterning this layer to define the other set of address conductors. A plurality of 2D arrays of memory elements stacked upon one another is produced successively in this manner to form a multi-level memory array device with each array having sets of address conductors. A set of address conductors associated with one array may serve also as one set of address conductors for an adjacent array. In this structure, therefore, each memory element in one array is individually addressable and each array of memory elements is addressed separately. The storage capacity of the memory device is thus determined by the number of memory elements in each array and the number of arrays.

SUMMARY OF THE INVENTION

It is an object of the present invention to provide an improved memory device using the above-described kind of memory element.

It is another object of the present invention to provide a memory device using the above-described kind of memory elements which has a comparatively large capacity and which can be fabricated in a simple and inexpensive manner.

According to the present invention there is provided a semiconductor memory device comprising a multiplicity of memory elements each comprising hydrogenated silicon-rich, amorphous silicon alloy material between a pair of contacts which is characterised in that the device comprises a layer of said amorphous silicon alloy material, sets of input and output contacts on opposing sides of the layer, and discrete conductive elements disposed in the layer which for each input contact define programmable conductive paths between the input contact and a plurality of output contacts. With this structure a three dimensional network of memory elements is available. Pairs of conductive elements within the layer and at an appropriately small spacing can, together with the alloy material situated therebetween, constitute a memory element programmable through current induced conductivity. Similarly, a memory element can be constituted by an input, or output, contact together with a conductive element within the layer and the region of alloy material separating them. When voltages are applied to input and output contacts, electrical current paths through the layer are generated with the conductive elements acting as nodes and, together with the intervening alloy material, forming programmed memory elements through the phenomenon of current induced conductivity which uses the generation of defects in the silicon-rich amorphous silicon alloy material to form a defect band through which an electrical current can pass. The present invention thus involves a more general approach to the use of current induced conductivity by moving away from a formal 2D structure to provide a three dimensional memory network. Unlike the memory array device of PCT WO 96/19837, which consists merely of separately addressable, formal 2D arrays stacked upon one another, the memory device of the present invention has a truly 3D structure. In some respects, the memory element structure obtained resembles a neural network.

The contacts of one, or both of the sets of input and output contacts may be in the form of strips. However, the sets of input and output contacts preferably both comprise regularly spaced contacts arranged in rows and columns in order to realise the potential of the memory structure to a further extent and achieve greater storage possibilities. The input and output contacts need not be aligned overlying one another however, and may have different pitches. The nodes constituted by the conductive elements within the alloy layer define possible current paths through the body of the alloy layer and enable defects to be generated to a concentration determined by the degree of current stressing and the defect concentration then determines the conductivity in localised regions of the alloy layer. Using this capability, the memory device structure can be programmed to give many outputs for each input that is a function of more than one input. It may also be possible to change the outputs for a given input as a function of the programming of neighbouring inputs. The structure may thus be considered to behave in the manner of a neural network with the processing power being embedded in the body of the structure. One application of the memory device could be as a very large memory. If, for example, every input contact in an n by n array has n by n outputs then the memory power would be n to the power of 4.

The conductive elements constituting the nodes may for simplicity comprise conductive particles quasi-randomly dispersed throughout the thickness of the amorphous silicon alloy layer. Alternatively, the conductive particles may be dispersed quasi-randomly at one or more discrete levels in the body of the alloy layer between its opposing sides. Preferably, however, the conductive elements comprise conductive layer portions formed at one or more discrete levels in the body of the alloy layer between the opposing sides. The positions and dimensions of the conductive layer portions are preferably predetermined. In this way, the programming possibilities can be organised to greater extent and more predictably than the case when using a random particle dispersion. The dimensions of the conductive layer portions can be varied. For example, some portions may be elongated compared with others so as to extend over distances greater than the spacing between input or output contacts to assist in the lateral spreading of possible programmed paths. Such conductive layer portions can readily be provided by patterning a deposited layer or layers of conductive material.

Programming of the device may be accomplished by applying a predetermined voltage between selected input and output contacts. However, the device may be programmed in an optical manner. To this end, the input contacts may comprise photoresponsive elements, for example photodiodes.

BRIEF DESCRIPTION OF THE DRAWINGS

Embodiments of semiconductor memory devices in accordance with the present invention will now be described, by way of example, with reference to the accompanying drawings, in which.

It will be understood that the Figures are merely schematic and are not drawn to scale. In particular certain dimensions such as the thickness of layers or regions may have been exaggerated whilst other dimensions may have been reduced. It should also be understood that the same reference numerals have been used throughout the figures to denote the same or similar parts.

DESCRIPTION OF THE PREFERRED EMBODIMENTS

Figure 1:
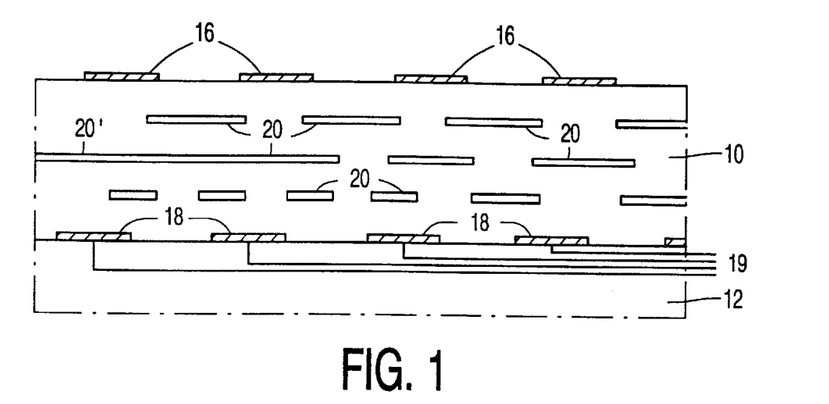
FIG. 1 is a schematic cross-sectional view through a first embodiment of memory device according to the invention.
Figure 2:
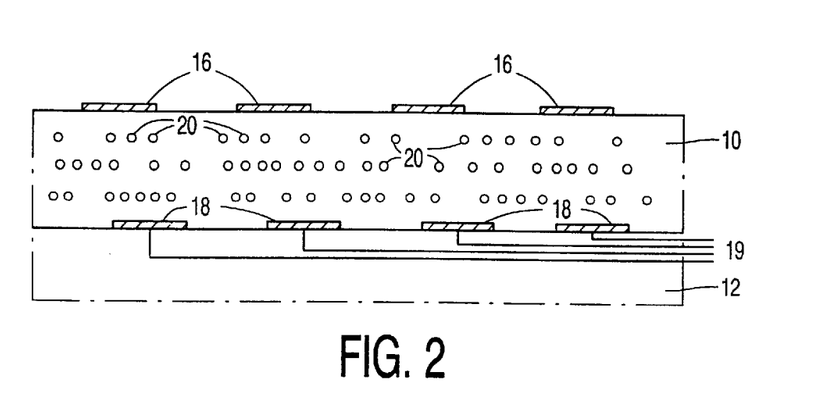
FIG. 2 is a schematic cross-sectional view through a second embodiment of memory device according to the invention.
Figure 3:
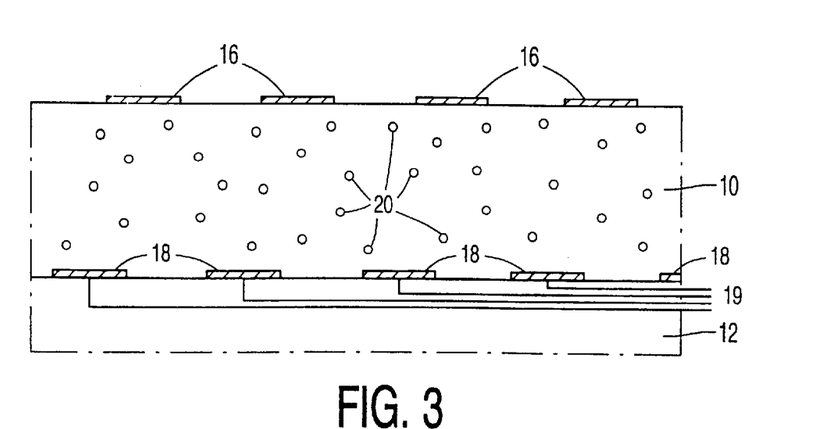
FIG. 3 is a schematic cross-sectional view through a third embodiment of memory device according to the invention.

The embodiments of memory devices of FIGS. 1 to 3 all use memory elements comprising an amorphous silicon alloy material between conductive contacts of a similar kind to those described in PCT WO 96/19837 whose disclosure in this respect is incorporated herein and to which reference is invited for a more detailed description of their general nature and operation as programmable elements. In these particular embodiments, the amorphous silicon alloy material comprises a hydrogenated, silicon-rich, amorphous silicon nitride alloy. However, a hydrogenated, silicon-rich amorphous silicon carbide, oxide, or oxynitride alloy may be used instead. The memory devices are fabricated using standard large area electronics thin film processing techniques. Referring to FIGS. 1 to 3, the alloy is provided as a layer 10 extending over the planar surface of an insulating substrate 12, for example of glass, and formed, for example, using a PECVD process. The proportions of nitrogen and silicon are selected such that the ratio of nitrogen to silicon in the resulting layer is less than 1.0 and greater than 0.2. On opposing sides of this layer 10, sets of electrically conductive input and output contacts 16 and 18 are provided which in these embodiments are in the form of discrete conductive pads arranged mutually separated and regularly spaced in rows and columns. The sets of contacts may be of a metal, for example chromium, formed by depositing a continuous layer of the conductive material, for example by an evaporation or sputtering process, and patterning the layer using a photolithographic and etching process to leave a row and column array of pads. The lower array of output contacts 18 is formed adjacent the surface of the substrate 12 prior to the deposition of the alloy layer 10 and the array of input contacts 16 is formed directly on the surface of the deposited alloy layer. Output signals from the output contacts 18 are obtained via output lines 19, here shown as an individual output line for each respective output contact for simplicity.

The memory devices further include discrete elements 20 of electrically conductive material provided in the body of the alloy layer. These conductive elements may be arranged at one or more discrete levels within the thickness of the alloy layer or in a randomly dispersed fashion throughout the thickness of the layer.

Referring to FIG. 1, in this embodiment a stacked 2D formal approach is used for the provision of the conductive elements 20. The conductive elements are disposed at a number of different, discrete, levels, in this case three levels, within the body of the alloy layer 10 intermediate the upper and lower major sides of the layer. The conductive elements 20 comprise individual, i.e. mutually separate, layer portions of conductive material, for example a metal such as chromium, with each level of elements being formed at different intervals during the deposition of the material constituting the alloy layer. Thus, after formation of the output contact pads 18 on the substrate surface part of the alloy layer 10 is grown over the contact pads and intervening substrate surface regions to a certain, predetermined, thickness, for example around 60 nm, using a PECVD process at, for example, 250° C. A layer of conductive material is then deposited and patterned photolithographically to form a first level of conductive elements 20 substantially parallel to the substrate surface. This is then followed by continuing the growth of the alloy layer material to a similar, predetermined, thickness and then forming a second level of conductive elements by depositing and patterning a layer of conductive material, and so on according to the number of intermediate levels of conductive elements required. The layer 10 is thus composed of a series of sub-layers. In this embodiment the thickness of each growth stage in the alloy layer formation is selected such that the mutual spacings between levels of conductive elements and the arrays of contact pads is substantially equal, with the planes of each level of conductive elements and the arrays of contact pads being substantially parallel to the substrate surface, but the thicknesses of the individual sub-layers of the alloy material, which together constitute the layer 10, could be different. Each level thus consists of a 2D array of discrete conductive elements. Typically, the conductive elements are rectangular in shape and of uniform thickness. However, the number of conductive elements and the sizes, i.e. length and width, of the individual elements 20 at each level may be varied, as demonstrated by the examples depicted in FIG. 1.

In the embodiment of FIG. 2 a stacked, 2D, random approach to providing the conductive elements is used. The conductive elements 20 are again arranged in the body of the alloy layer 10 at discrete and equally spaced levels intermediate the arrays of input and output contacts 16, 18. In this case, however, the conductive elements 20 comprise instead small metallic particles which are quasi-randomly dispersed at the respective levels. Each level thus comprises a 2D quasi-random array of the conductive particles. The particles are provided, for example, by scattering the particles over the alloy material at various stages during the formation of the layer 10 and can comprise small grains of metal, such as chromium, palladium, platinum etc, around approximately 10 nm diameter. The particles may be provided instead using a laser ablation technique or by means of deposition from a colloidal solution.

In the embodiment of FIG. 3, a 3D random approach is used for providing the conductive elements. The conductive elements 20 used in this embodiment again comprise conductive particles but in this case are quasi-randomly dispersed throughout the thickness of the layer 10 so as to achieve a 3D quasi-random distribution, with sufficient numbers of particles to achieve a desired average density.

In all the above embodiments, different lay-outs of input and/or output contacts could be used. They could, for example be provided as strips but this would considerably diminish programming options, that is, the number of available programmed states. The output contacts could be positionally aligned with the input contacts but this is not necessary. Also the pitch of the input contacts can differ from that of the output contacts.

Programming in these embodiments of memory devices is accomplished using a current induced conductivity effect produced by electrical current stressing to generate defects in the a-Si Nx:H material and form defect bands through which electrical current can pass. The conductive elements 20 act as nodes enabling defects to be generated in the region of alloy material between neighbouring nodes as well as between an input contact pad 16 or an output contact pad 18 and its neighbouring conductive element(s) 20 whereby a multiplicity of possible current paths can be created through the body of the alloy layer 10. A pair of conductive elements or a combination of a contact pad and a conductive element, whose physical separation lies within a certain range, typically between, for example, 10 to 60 nm, form together with the intervening region of the alloy layer a memory element. At spacings less than 2 nm, tunnelling can occur so that conductive elements spaced apart at such a distance or less tend to behave more like a continuous conductor. The memory elements are comparable, and effectively equivalent, to the more formal structure of memory elements described in the aforementioned PCT WO 96/19837, comprising layers of conductive material, serving as contacts, between which the amorphous silicon alloy layer is sandwiched, and can be utilised in similar manner to provide a memory effect by generating therein a defect band, through current stressing, which lowers the activation energy for the transport of carriers by a selectable amount. The density of defects in the defect band, and consequently the resulting conductivity, can be determined by the degree of current stressing. For a fuller description of the mechanism involved and the electrical behaviour of such memory elements reference is invited to that publication. Briefly, the contact pads and conductive elements and regions of alloy material therebetween constitute a form of MSM (metal-semiconductor-metal) structured thin film diode which basically comprises a back to back Schottky barrier device. When an electrical current of sufficient current density is caused to flow though the structure upon the application of a voltage across its contacts a defect band containing silicon dangling bonds is induced throughout the region of the alloy material where current flows, causing a change in its I-V characteristics, which remains after removal of the applied voltage. The induced defect band reduces the activation energy for transport of carriers, the amount of reduction being selectable and dependent on the concentration of distribution of energies of the defects and which in turn is dependent on, and determined by, the current density and amount of charge passed during current stressing. Thereafter, upon the application of relatively low voltages leakage current is apparent whose magnitude depends on the induced defect band.

In the embodiments of FIGS. 1 and 2 the thickness of the regions of alloy material between the levels and the density of conductive elements in a level are selected so as to enable such effects to occur. In the embodiment of FIG. 3, the amount, and hence average density, of conductive particles randomly dispersed in the alloy layer similarly is selected to ensure that such effects can occur.

FIGS. 1 to 3 show only vertical sections through a particular part of the memory device and it will be appreciated that the conductive elements 20 are present within the body of the alloy material 10 such that conductive paths can occur not just vertically down from an input contact but with a lateral, sideways, component as well so that a conduction path to an output contact 18 away from the output contact more immediately below that input contact can be formed. Such "spreading" of the conduction paths formed by programming can be assisted in the case of the embodiment of FIG. 1 by providing certain conductive elements so as to be longer in one dimension than others, as for example illustrated by the particular conductive element referred 20' in FIG. 1.

The devices can be programmed by applying voltages between selected input and output contacts 16 and 18 and the programming may be such as to give many outputs for each input or an output that is a function of more than one input.

To illustrate the programming a simple example will now be described with reference to FIG. 4 which shows a possible programming for a memory device, in this case a simple form of the memory device of FIG. 1 having only one intermediate level of conductive elements spaced mid-way between the input and output contacts. A suitable programming potential applied between the input and output contacts 16 and 18 labelled A and B will cause a current to flow from A to B though the regions of the alloy layer 10 labelled X and Y via the intermediate conductive element 20, and resulting in defect bands being created across the regions X and Y whose extent, as signified by the solid lines, corresponds generally to the extent of overlap between the element 20 and 16A and 18B. When the defect density within the regions X and Y reaches a certain level a leakage mechanism is introduced whereby charges will be able to migrate through the alloy layer at these regions by hopping from one defect site to another. In this way the connection A-B is effectively set to 'on' defining, for example, a 1 binary. A path between A and E via the conductive element 20 is not established because current which flows between A and E is very much smaller than that flowing between A and B and consequently there is no significant defect generation. A potential applied between the input and output contacts labelled C and D similarly results in defect states being induced in the regions of the alloy layer 10 labelled P, Q, R and S. Defect states are also introduced into the region Z but since the alloy material here is continuous between C and D without an intervening metal layer portion the effect of charge trapping is significantly greater than in the regions P and Q, or R and S, for example and this will reduce the current passing through this region at a given stressing voltage during programming compared with that flowing through P and Q. For further details of the nature of the behaviour of the alloy material in this respect, reference is invited to the paper by J. M. Shannon et al entitled "Current Induced Drift Mechanism in Amorphous SiNx:H Thin Film Diodes" published in Applied Physics Letters, Vol. 65 No. 23, 1994, at pages 2978–2980.

After the programming potentials have been removed, the effects remain so that the paths, X and Y, between contacts A and B, and P and Q and R and S, between contacts C and D, stressed into leakage thereafter exhibit a far greater current flow for a comparatively small applied reading voltage than unstressed regions. The stressed paths A to B and C to D therefore provide high current flow at a low read voltage and can be used to represent an on state (or 1 binary) whereas the unstressed paths, e.g. A to E, which provide only a very low current at a low read voltage can be used to represent an off state (or 0 binary). Thus, each path can hold a binary digit of data.

Figure 5:
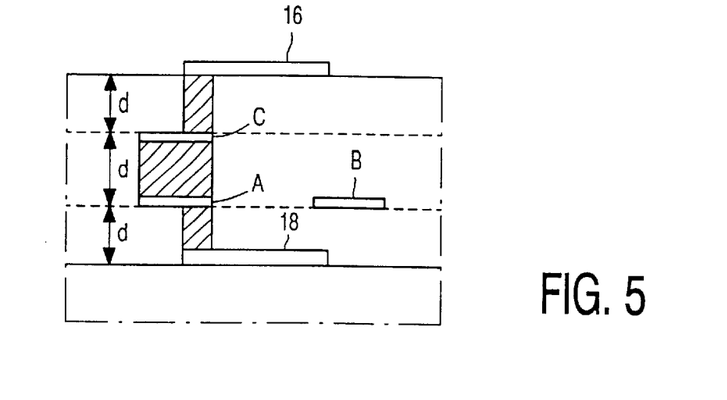
FIG. 5 illustrates an example programming in part of a memory device having two intermediate levels of conductive elements.

Similar rules apply in devices having more than one intermediate level of conductive elements. FIG. 5 illustrates part of an example device having two intermediate levels of conductive elements spaced evenly apart between the input and output contacts such that the distances, d, between the two intermediate levels and between the input and output contacts and the nearest intermediate level are the same. Upon programming, a conduction path, represented here by hatching, between the contacts 16 and 18 can be established via the conductive elements labelled A and C in the first and second intermediate levels respectively but not via the conductive element B, since, as outlined above, the thickness of the alloy material between 16 and B is continuous over a distance 2 d.

Figure 4:
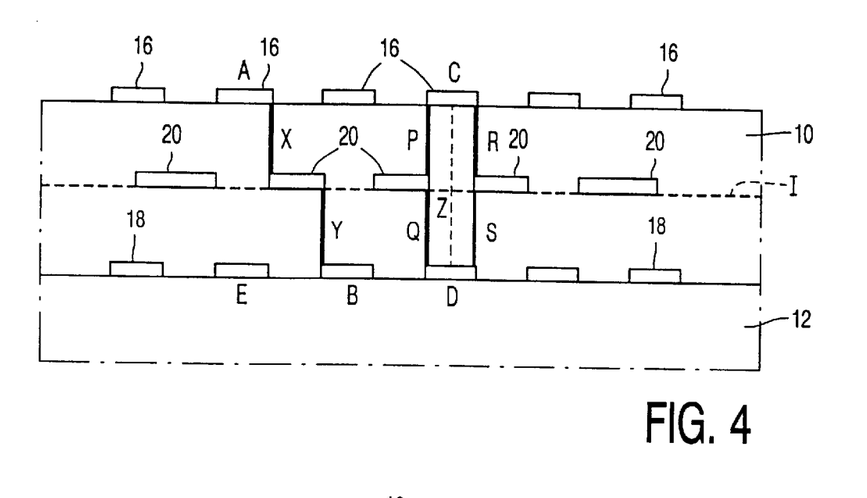
FIG. 4 illustrates an example programming in part of a memory device having one intermediate level of conductive elements.

The interface between the two a-SiNx:H sub-layers required by the fabrication process for this form of memory device, denoted by the line labelled I in FIG. 4, might contain more defects than the rest of the alloy layer 10 due perhaps to poor adhesion between the two sub-layers and the possibility of contamination being introduced before the top sub-layer is deposited. However, problems in this respect can be avoided through cleaning the upper surface of the first deposited sub-layer with fuming nitric acid and then dip etching in HF to remove a thin surface layer of the a-SiNx:H together with any contaminants which may be present.

In an experimental example of the kind of device shown in FIG. 4, the overall thickness of the alloy layer 10 was selected to be approximately 70 nm, such that the level of the conductive elements, which comprise chromium layers approximately 50 nm in thickness is situated centrally approximately 35 nm from both sides. The voltage used for programming was around 23 volts and current stressing was carried out using pulse current of around ±1 Amp. cm$^{-2}$ of 100 $\mu$s duration separated by 100 $\mu$s intervals for approximately 100 seconds.

Figure 6:
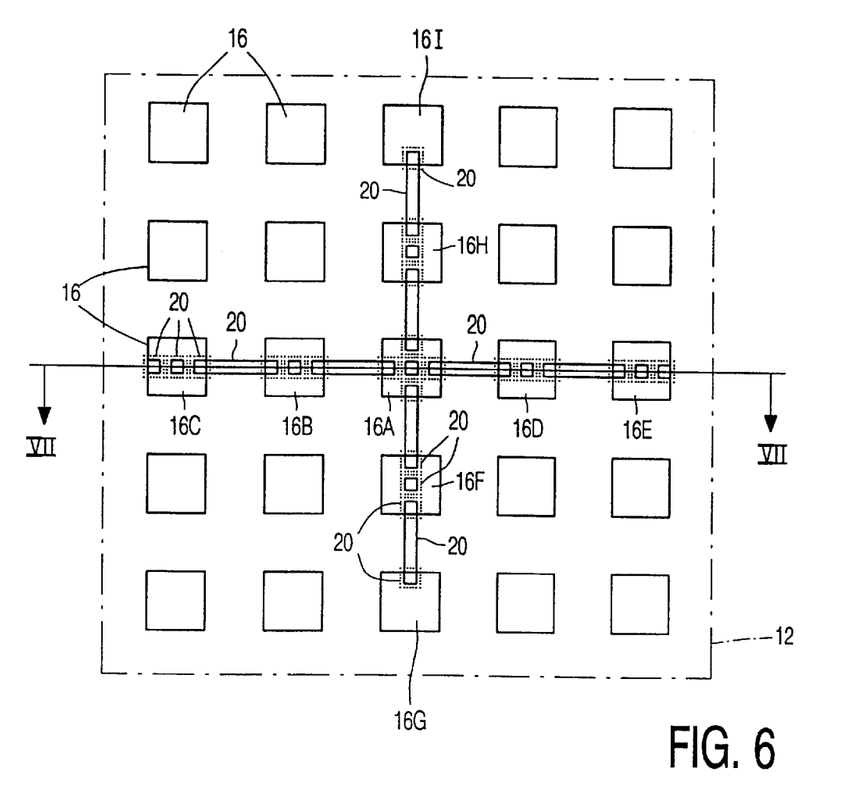
FIGS. 6 and 7 are plan and sectional views respectively through a part of a memory device having two intermediate levels of conductive elements illustrating programming possibilities.
Figure 7:
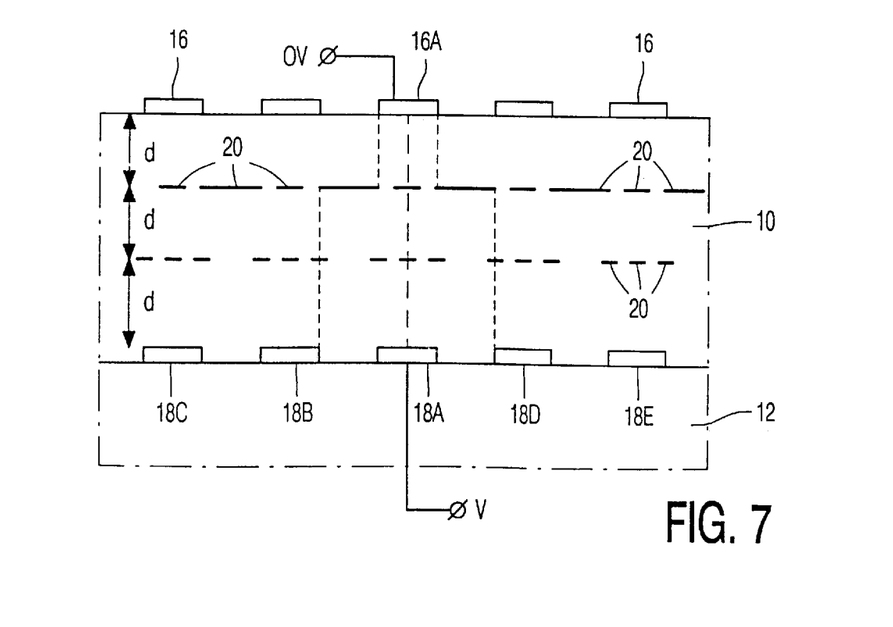

Of course, for a device of the kind shown in FIG. 1, having more than one level of conductive elements 20, then the programming capabilities are considerably increased by virtue of further possibilities for programmed paths. To demonstrate this, another example of programming a memory device will now be described with reference to FIGS. 6 and 7. FIG. 6 shows schematically in plan view of a region of a memory device of the kind shown in FIG. 1 having two intermediate levels of conductive elements. The sets of input and output contacts 16 and 18 are arranged in aligned row and column arrays. The part of the device shown comprises a group of five adjacent input contacts 16 in five adjacent columns. FIG. 7 is a vertical section along the line VII—VII of FIG. 6. It will be appreciated that the output contacts 18 correspond positionally to the input contacts 16 such that each output contact 18 lies directly below a respective input contact 16 and that conductive elements are provided at two levels intermediate the planes of the input and output contacts with the spacings, d, between the levels and the input and output contact planes, as determined by the thickness of the three sub-layers of silicon alloy material, are approximately equal. FIG. 7 shows in the form of solid lines the conductive elements 20 in each level in this vertical section. For simplicity, only a selected few of the conductive elements 20 present are actually shown, namely those associated with a certain group of input/output contacts. In this figure, the conductive elements in the upper level, i.e. the level closest to the input contact array, are depicted by solid lines and the conductive elements in the lower level are depicted by dotted lines. As each level in this fragment of the device consists of a two-dimensional defined pattern of conductive elements, it will be understood that further conductive elements are present behind and in front of those shown in FIG. 7, some of which appear in FIG. 6. Thus, conductive elements 20 arranged in each level in a manner similar to those in FIG. 7 extend in a direction at right angles to those shown, i.e. columnwise, and a cross-section of the fragment along a central line perpendicular to the line VII—VII of FIG. 6 would appear generally similar to FIG. 7. Some of the conductive elements effectively behave as conductive bridges extending across the gaps between adjacent input contacts or output contacts.

The configuration shown enables five outputs for each input on an input contact 16 and an example of programming the device in this manner will now be described. Considering the case of the central input contact in FIG. 6, labelled 16A, it may be desired to programme the device so that when a read voltage signal is applied to this input contact, outputs are obtained from the output contact immediately underlying this in put contact, i.e. the contact 18A in FIG. 7, the two adjacent output contacts to either side of the output contact 18A in the same row, labelled 18B, and 18D, and the two adjacent output contacts on either side of the output contact 18A in the same column, i.e. the output contacts 18F and 18H underlying the input contacts 16F and 16H in FIG. 6, making five outputs altogether from a cross shape group of adjacent output contacts. The particular conductive elements 20 shown in FIG. 6 are those which are used to enable such programming. Programming is achieved as described previously by applying a write voltage between the input contact 16A and those of the output contacts 18A, B, D, F and H from which a binary 1 is required so as to define necessary current paths through current induced conductivity. (For those output contacts from which a binary 0 is required the write voltage application operation is not needed). For this writing operation, the input contact 16A may be earthed and a voltage V applied to each of the selected output contacts in turn. A voltage V/2 may be applied to all but the selected output contacts so as to reduce the risk of unintended current paths being generated between the selected output contact and adjacent conductive elements 20 and a non-selected output contact. If the output contact 18A is to provide a binary 1 on readout then a conductive path is established between the input contact 16A and output contact 18A via the conductive elements 20 in the two levels directly below the input contact 16A, as indicated by the dashed line. Example paths through which conduction can be established between the input contact 16A and output contacts 18B and 18D upon programming by the application of a write voltage so as to provide binary 1 outputs for these output contacts upon read-out, are indicated by the dotted lines. The programming possibilities can be considerably increased by providing further conductive elements of different lengths in each level alongside those shown in FIG. 7 and extending within the vertically projected area of an input and output contact such that there are rows of conductive elements in each level underlying each row or each column of input contacts 16. Also, the number of levels at which conductive elements are provided can be increased.

It will be understood that the devices of FIGS. 2 and 3 can be programmed and read out in similar manner with the conductive particles serving as nodes like the photolithographically defined conductive layer portions in the device of FIGS. 6 and 7. Because the conductive elements in these devices comprise conductive particles in a quasi-random distribution rather than being defined, in terms of shape and position, as in the case of the conductive elements in the above-described embodiment the conductive path established by the programming operation may be less predictable.

Figure 8:
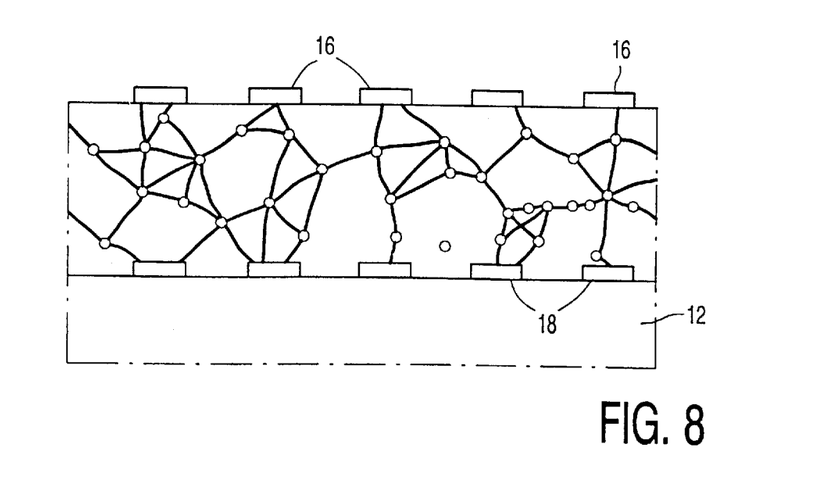
FIG. 8 illustrates an example programming in part of a memory device using randomly dispersed conductive elements.

FIG. 8 shows the kind of network of paths which could be formed upon programming in the memory device of FIG. 3.

Although the programming operation described above entails selecting the input contacts individually in turn, it is possible to select two, or more, input contacts simultaneously for programming. The data then stored can be read out by again selecting the same two, or more, input contacts simultaneously.

Figure 9:
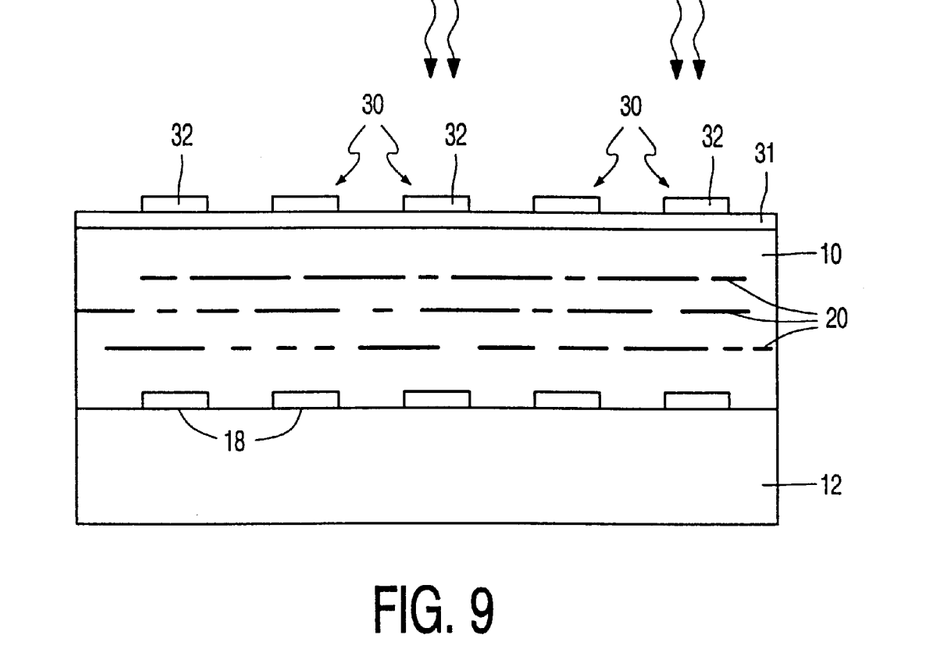
FIG. 9 is a cross-sectional view through part of a memory device adapted to be programmed optically.

The memory devices may be programmed in an optical manner. FIG. 9 shows a schematic sectional view through part of an embodiment of memory device designed for optical programming. In this device, the upper array of contact pads 16 is replaced by an array of amorphous silicon photoconductive elements 30. These are formed by providing a layer of hydrogenated amorphous silicon 31 over the surface of the silicon nitride alloy layer 10 on which an array of transparent conductive pads, 32, for example of ITO, are formed mutually spaced in an X-Y matrix and defining individual photoconductive elements of the array. To program the device, a 2D spatially modulated light pattern representing data to be stored is directed onto the upper side of the photoconductive element array and an electrical potential (e.g. ground) applied to the ITO pads and applying a write voltage to one of the output contacts 18. At those regions receiving light of an adequately high intensity the amorphous silicon material underlying the ITO pads is rendered conductive so that surface regions of the silicon alloy layer 10 at the areas of the layer underlying those ITO pads corresponding spatially with the higher intensity components of the illuminating pattern are effectively grounded so as to achieve an effect similar to that provided by the discrete input contacts 16. The ITO pads in each row may be connected together electrically so as to enable the pads in one row to be grounded simultaneously. During a programming operation, each row of pads is then grounded in turn so that programming is performed on a line at a time basis.

Different data image patterns can be stored by selecting a different output contact pad each time during programming. For read-out, a read voltage is applied to an individual output contact 18 so as to generate at the input contacts 16 a current pattern indicative of the optical image.

Rather than using a 2D image pattern, information can instead be stored by means of a spot of light which is scanned over the array of ITO pads 32.

The silicon alloy material used in all the above embodiments may comprise hydrogenated, silicon-rich amorphous silicon carbide oxide, or oxynitride rather than nitride.

Figure 10:
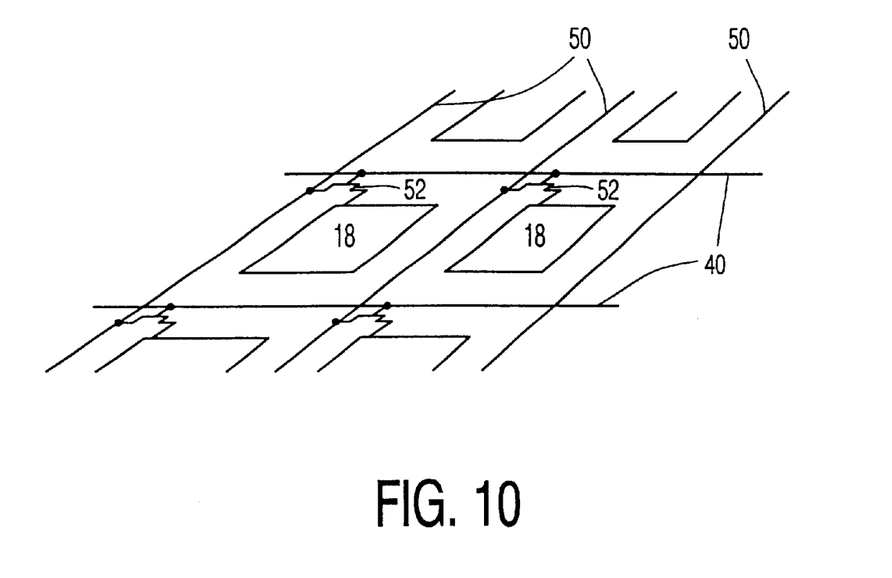
FIG. 10 illustrates part of one possible form of addressing arrangement for the memory devices.

Connection to the output contacts 18 for programming or read-out in these memory devices can be simplified using an active matrix addressing approach. An example of this, showing a few of the output contacts 18 from the array, is illustrated in FIG. 10. Sets of row and column address lines 40 and 50 extend between the rows and columns of contacts 18. Each contact is connected to an associated column address line 50 via a switch 52, for example a TFT, whose gate is connected to an associated one of the row address lines 40. All the contacts 18 in one column are associated with a respective column address line 50 and all the contacts 18 in one row are associated with a respective row address line 40. By applying a gate voltage to a particular row address line the associated TFTs are turned on. A voltage applied simultaneously to one, or more column address lines 50 is then transferred to the contact 18. In this way a write voltage can be applied to selected output contacts 18 when programming the device. Similarly a current appearing on an output contact 18 upon read-out can be sensed by selecting each row line 40 in turn with a gating signal so as to turn on the TFTs of that row and sensing the current on the individual column lines 50.

This active matrix addressing scheme is similar to that used, for example, in active matrix LCDs and can be fabricated on the surface of the substrate 12 of the memory device using standard large area electronics processing techniques prior to the deposition of the amorphous silicon alloy material. Preferably, the plane of the output contacts 18 is spaced above that of the TFTs and address lines by means of an intervening layer of insulator material, through which connection between the contacts and their respective TFTs is achieved via windows, so as to isolate the memory device structure from the active matrix array.

From reading the present disclosure, other modifications will be apparent to persons skilled in the art. Such modifications may involve other features which are already known in the field of semiconductor memory devices and component parts thereof and which may be used instead of or in addition to features already described herein.

What is claimed is:

1. A semiconductor memory device comprising a three-dimensional structure having a multiplicity of memory elements each comprising hydrogenated, silicon-rich, amorphous silicon alloy material between a pair of contacts, characterized in that the device comprises sets of input and output contacts on respective opposing sides of a layer of said amorphous silicon alloy material, the sets of input and output contacts forming contact matrices, and mutually-separate and electrically-unconnected discrete conductive elements disposed in the layer which for each input contact define programmable conductive paths between the input contact and a plurality of output contacts.

2. A semiconductor memory device according to claim 1, characterized in that the sets of input and output contacts each comprise regularly spaced contacts arranged in rows and columns.

3. A semiconductor memory device according to claim 1 characterized in that the conductive elements comprise conductive layer portions formed at one or more discrete levels in the body of the amorphous silicon alloy layer between its opposing sides.

4. A semiconductor memory device according to claim 3, characterized in that the position and dimensions of the conductive layer portions at the or each discrete level are preselected.

5. A semiconductor memory device according to claim 3, characterized in that, with the sets of input and output contacts defining input and output levels respectively, the thickness of the amorphous silicon alloy material between adjacent levels is between 10 and 60 nm.

6. A semiconductor memory device according to claim 5, characterized in the thickness of amorphous silicon alloy material between each pair of adjacent levels is substantially equal.

7. A semiconductor memory device according to claim 1, characterized in that the conductive elements comprise conductive particles dispersed randomly at one or more discrete levels in the body of the alloy layer between its opposing sides.

8. A semiconductor memory device according to claim 7, characterized in that, with the sets of input and output contacts defining input and output levels respectively, the thickness of the amorphous silicon alloy material between adjacent levels is between 10 and 60 nm.

9. A semiconductor memory device according to claim 1, characterized in that the conductive elements comprise conductive particles dispersed randomly throughout the thickness of the alloy layer.

10. A semiconductor memory device according to claim 1, characterized in that the device is optically programmable with the input contacts comprising photoresponsive elements.

11. A semiconductor memory device according to claim 1, characterized in that the contacts of at least one of the sets of input and output contacts are arranged in a matrix array and addressed by an active matrix addressing circuit comprising sets of address conductors and a respective switching device connected to each contact.

* * * * *